United States Patent
Novacek et al.

(12) 
(10) Patent No.: US 12,182,481 B2
(45) Date of Patent: Dec. 31, 2024

(54) FRAMEWORK DATASET FOR AN ESCALATOR OR A MOVING WALKWAY

(71) Applicant: INVENTIO AG, Hergiswil (CH)

(72) Inventors: Thomas Novacek, Schwechat (AT); Andreas Drahohs-Föderler, Bad Fischau-Brunn (AT); Barbara Pohl, Stockerau (AT); Johannes Drögsler, Gumpoldskirchen (AT); Robert Bartonik, Gerasdorf bei Wien (AT); Stefan Brinskelle, Vienna (AT)

(73) Assignee: Inventio AG, Hergiswil (CH)

( * ) Notice: Subject to any disclaimer, the term of this patent is extended or adjusted under 35 U.S.C. 154(b) by 920 days.

(21) Appl. No.: 17/286,686

(22) PCT Filed: Oct. 14, 2019

(86) PCT No.: PCT/EP2019/077715
§ 371 (c)(1),
(2) Date: Apr. 19, 2021

(87) PCT Pub. No.: WO2020/083684
PCT Pub. Date: Apr. 30, 2020

(65) Prior Publication Data
US 2021/0342497 A1    Nov. 4, 2021

(30) Foreign Application Priority Data

Oct. 25, 2018 (EP) ..................................... 18202653

(51) Int. Cl.
*G06F 30/13* (2020.01)
*B66B 23/14* (2006.01)
(Continued)

(52) U.S. Cl.
CPC .............. *G06F 30/13* (2020.01); *G06F 30/12* (2020.01); *G06F 30/17* (2020.01); *B66B 21/02* (2013.01);
(Continued)

(58) Field of Classification Search
None
See application file for complete search history.

(56) References Cited

U.S. PATENT DOCUMENTS 9,457,995 B2 * 10/2016 Makovec ................ B66B 27/00
9,850,100 B2 * 12/2017 Blondiau .............. B66B 25/006
(Continued)

FOREIGN PATENT DOCUMENTS

CN       104661948 A     5/2015
CN       104684836 A     6/2015
(Continued)

OTHER PUBLICATIONS

Yin, Xiaowei & Qian, Wenxue & Pham, Hoang. (2018). Parametric simulation analysis and reliability of escalator truss. Open Physics. 16. 938-942. 10.1515/phys-2018-0115. (Year: 2018).*
(Continued)

*Primary Examiner* — Akash Saxena
(74) *Attorney, Agent, or Firm* — Knobbe, Martens, Olson & Bear, LLP

(57) ABSTRACT

The application relates to a method for creating a framework or truss dataset of an escalator or moving walkway using a computer program. In this method, client-specific configuration data are collected, a type-specific, two-dimensional layout is selected, and this layout is adapted in terms of the conveyor height in accordance with the configuration data. In addition, the guideway of the adapted layout is checked using division sections and the layout is transformed into a subdivided two-dimensional layout. The latter is overlaid
(Continued)

with fields of defined structure, wherein the resulting overlaid layout serves as a starting point for arranging profile bar datasets in the three-dimensional space.

15 Claims, 6 Drawing Sheets

(51) Int. Cl.
    *G06F 30/12*         (2020.01)
    *G06F 30/17*         (2020.01)
    *G06T 17/00*         (2006.01)
    *B66B 21/02*         (2006.01)
    *B66B 21/04*         (2006.01)
    *B66B 23/10*         (2006.01)

(52) U.S. Cl.
    CPC ............... *B66B 21/04* (2013.01); *B66B 23/10* (2013.01); *B66B 23/14* (2013.01); *G06T 17/00* (2013.01)

(56) References Cited

U.S. PATENT DOCUMENTS

| | | | |
|---|---|---|---|
| 9,944,496 B2 * | 4/2018 | Matheisl | B66B 21/10 |
| 11,487,913 B2 * | 11/2022 | Novacek | G06F 30/20 |
| 11,572,257 B2 * | 2/2023 | Salojärvi | B66B 23/00 |
| 2003/0136634 A1 * | 7/2003 | Ogura | B66B 21/025 |
| | | | 198/334 |
| 2018/0319631 A1 * | 11/2018 | Illedits | B65G 21/02 |
| 2020/0293700 A1 * | 9/2020 | Eder | B66B 31/00 |
| 2021/0342497 A1 * | 11/2021 | Novacek | G06F 30/13 |
| 2024/0176933 A1 * | 5/2024 | Xiao | G06V 10/764 |

FOREIGN PATENT DOCUMENTS

| | | | | |
|---|---|---|---|---|
| CN | 104703904 A | 6/2015 | | |
| CN | 105829236 A | 8/2016 | | |
| CN | 106458524 A | 2/2017 | | |
| CN | 108290719 A | 7/2018 | | |
| EP | 3121143 A1 | 1/2017 | | |
| EP | 2527283 B1 * | 5/2018 | ............ | B66B 21/00 |
| JP | 2006188295 | 7/2006 | | |
| WO | WO 2018153846 A1 | 8/2018 | | |

OTHER PUBLICATIONS

K. Bhaskar et al. "Design and Analysis of Escalator Frame." International Journal of Advanced Scientific Technologies in Engineering and Management Sciences. vol. 2, No. 9. Sep. 2016. pp. 7-13.

International Search Report for International Application No. PCT/EP2019/077715 dated Dec. 17, 2019.

* cited by examiner

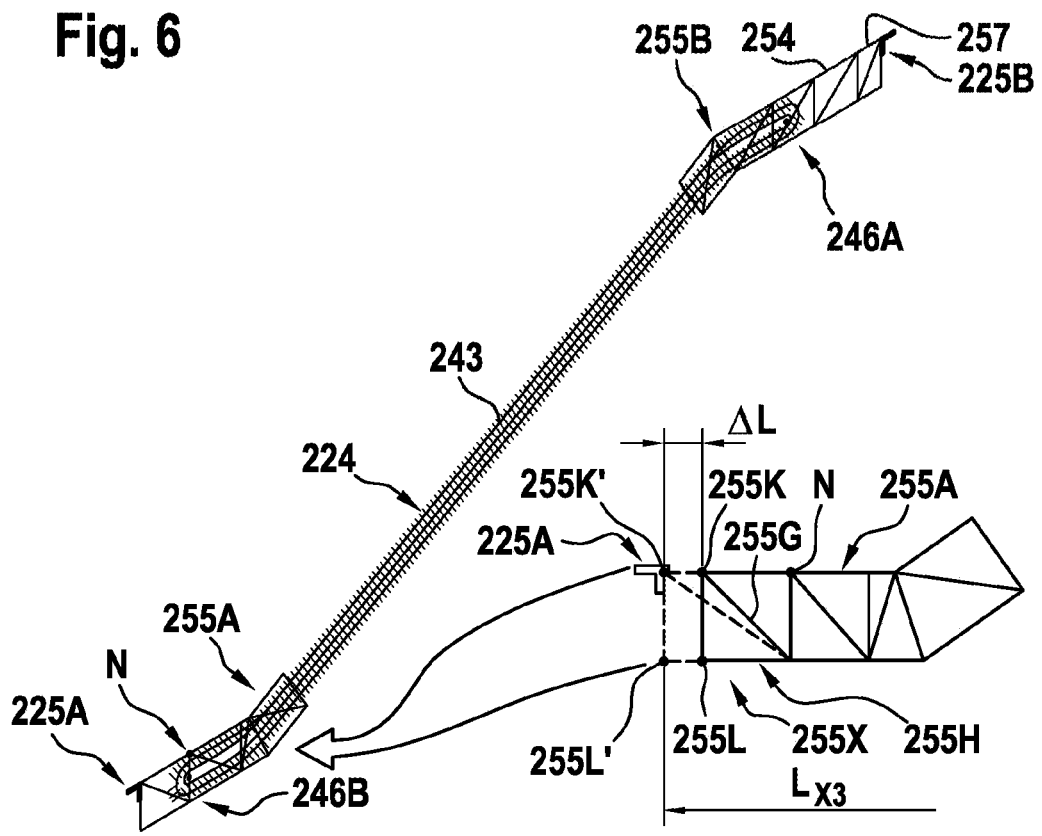
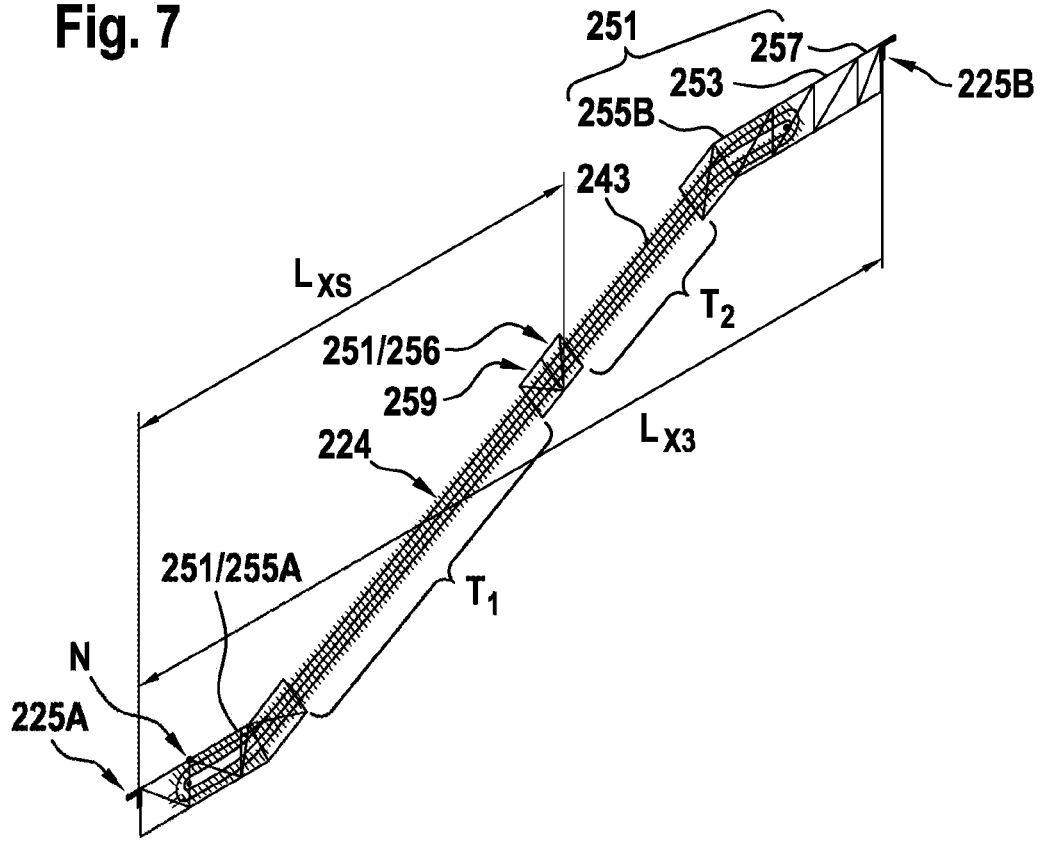

FRAMEWORK DATASET FOR AN ESCALATOR OR A MOVING WALKWAY

TECHNICAL FIELD

This application relates to a method for creating a three-dimensional dataset for a framework or truss of an escalator or moving walkway.

SUMMARY

Escalators and moving walkways are commonplace systems for transporting people that can be used in, for example, public transport facilities such as train stations, airports, subway stations, and so forth. Furthermore, many of these systems are also found in department stores, shopping malls, amusement parks, etc. Depending on the field and place of use, these systems for transporting people are subject to various requirements, which are specified not only by sets of standards such as EN115-1 but also by the client-specific requirements such as conveying capacity and conveyor height.

The core of these systems for transporting people in each instance is a supporting structure, which is typically configured as a truss (or framework). All other components of the escalator or moving walkway are mounted in and on this truss. The truss supports the weight of these components, eventually the load to be transported, and its own weight by means of bearing points in the building. The supporting structures configured as trusses typically consist of a multiplicity of profile bars, which are interconnected in a frame-like manner by welding, riveting, etc. The profile bars are designated according to their function; hence a truss may comprise top beams, bottom beams, uprights, diagonal struts, transverse struts, and so forth. A supporting structure or truss of the aforementioned type is disclosed in, for example, EP 3121143 A1.

Because of the client-specific requirements, nearly every truss has a batch size of one, or to put it another way, most trusses are unique items. They may only differ very slightly from one another, for example, one truss otherwise identical in design may differ from the other truss by a centimeter in terms of its conveyor height. For this reason, an individual construction effort can be necessary in each instance in order to produce one of these client-specific trusses. This individual construction effort comprises a creation of production documents such as drawings, parts lists, materials lists, and so forth. As a result, the truss of an escalator or moving walkway is not only the largest but also by far the most expensive component.

The object of this disclosure is therefore that of specifying a method which substantially reduces the individual construction effort for a truss configured to client specifications and with which this truss can be produced more economically.

This object is achieved by a method for creating a three-dimensional truss dataset of an escalator or moving walkway by means of a computer program executed in a computer system.

By means of this computer program, the following method steps are carried out, wherein these method steps can be executed in this sequence, but do not have to be executed in this sequence.

Client-specific configuration data are determined in a method step, which data contain information on at least the step width and the conveyor height. To this end, the computer program can carry out steps which generate input masks with input fields on a screen and for example, query the step width and conveyor height desired by the client. The step width can obviously also be calculated from a desired width of the escalator or moving walkway or from a required transport capacity, provided that the fundamentals such as a width allowance needed for guide tracks, for the mounts thereof and for the profiles of the truss, the required conveying speed, and so forth are present in, for example, a set of rules of the computer program.

Optionally, a logfile provided by the client can be accessed by the computer program in order to extract corresponding data from this logfile. Such a logfile can be generated by, for example, the client by means of a program, which provides the client with a so-called BIM (building information model). Such BIMs are digital, three-dimensional shell models of escalators or moving walkways, which are configured by the client using inputs and which the client can then integrate in the client's digital three-dimensional building model.

In a further method step, a type-specific two-dimensional layout based on the client-specific configuration data can be proposed by the computer program. This two-dimensional layout, arranged in a plane of a three-dimensional space, essentially comprises the guideway of a revolving conveyor chain and preferably has a defined origin in the three-dimensional space. This origin can be designed and defined in any manner, for example, it can also be present as a point cloud having points queried independently of one another and arranged in the three-dimensional space. It is merely important for at least one point in the three-dimensional space to be linked to the two-dimensional layout.

In a sense, the two-dimensional layout is a template which is characteristic for a specific type of escalator or moving walkway. Products are developed as so-called types in order to optimize the production engineering effort. This means that, for example, a certain escalator type is designed for conveyor heights up to 6 meters, whereas another escalator type is designed for conveyor heights from 6 meters to thirty meters. The type-specific, two-dimensional layouts of these two escalator types differ from each other in terms of, for example, the permissible slope of the guideway in the inclined portion of the escalator, the transition curves of the guideway, and the length of the horizontal portions of the guideway, which are arranged in the two access zones adjoining both ends of the inclined portion. If features are designated as "type-specific" in the following, these features are always consistent with the corresponding, type-specific two-dimensional layout.

The position specifications "horizontal," "vertical" and "inclined" used in this description generally always refer to the planned installation position of the truss in a structure. Furthermore, the feature "conveyor height" refers to the vertical distance between the two bearing points arranged in the access zones, whereas the feature "bearing space" refers to the horizontal distance between the two bearing points.

More precisely, the two-dimensional layout is a lateral view of the guideway of the conveyor chains, as specified in a type-specific manner on a physical escalator or on a physical moving walkway by the guide tracks thereof.

The type-specific two-dimensional layout can obviously also be chosen by manual input, wherein the computer program preferably checks whether the product on which the selected two-dimensional layout is based can comply with certain client-specific configuration data such as the bearing space or conveyor height. In the case of non-compliance, the computer program can preferably output a warning and/or a suggestion for another product or type-specific layout.

The proposed two-dimensional layout or the one chosen by manual input is a template, but still does not satisfy the client-specific requirements. In a further method step, this two-dimensional layout is therefore adapted in terms of the conveyor height, starting from the origin. Logically, the length of the guideway also changes as a result.

In a further method step, the guideway of the layout adapted in terms of the conveyor height is subdivided into division portions in an initial recording. The length of the division portions corresponds to the spacing of two sequential hinge points of a type-specific conveyor chain. A remnant division portion, which is smaller than the other division portions, may be left. A type-specific conveyor chain is the one that is provided for the respective escalator or moving walkway types on which the two-dimensional layout is based. The type-specific conveyor chain is part of a step band or pallet band arranged in a revolving manner in the escalator or in the moving walkway, respectively, which in addition to the conveyor chains consists of a multiplicity of identical components such as rollers, step elements, pallets, and so forth arranged in a recurrent manner on the conveyor chain. The division and thus also the division portions can obviously also be based on the recurrent arrangement of the other components of the step band or pallet band. A belt, for example, can be provided in the step band or pallet band in lieu of a conveyor chain.

If there is a remnant division portion in the initial recording, the circumferential length of the guideway is increased in a further method step until the remnant division portion has the same length as the rest of the division portions. Only thus is it possible to arrange a type-specific conveyor chain having only entire chain plates (or more precisely chain plates with identical gauge) in a revolving manner on the guideway, without having to use a provided clamping area of the conveyor chain.

Because a conveyor chain is typically composed of narrow and wide chain links, the ends of such a conveyor chain can only be connected to one another if a narrow chain link meets a wide chain link at the junction point formed as a hinge point. This condition is contingent upon an even number of division portions or hinge points. In the case of an odd number of division portions, the circumferential length of the guideway can therefore be lengthened by a further division portion in a further method step during the initial recording.

The guideway of the layout has two deflection zones, and a forward run portion and a return portion between the deflection zones. In the case of a two-dimensional layout of an escalator or of an inclined moving walkway, the deflection zones are arranged in the above-mentioned horizontal portions of the access zones and the forward run portion and the return portion extend in the horizontal portions, in the inclined portion and in the transition curves between the horizontal and inclined portions. In the case of horizontal moving walkways, the deflection zones are also arranged in the access zones, and the forward run portion and the return portion extend horizontally between the two deflection zones. To enlarge the guideway, the forward run portion and the return portion can be lengthened by linearly displacing one of the two deflection zones without changing the conveyor height and starting from the origin. Or to express it another way, in order to make this adjustment one of the deflection zones is or both of the deflection zones are displaced horizontally until the remnant division portion has the same length as the other division portions and (if a conveyor chain having wide and narrow chain links is provided) the conveyor path can be divided into an even number of division portions.

In a further method step, the adapted, two-dimensional layout can now be overlaid with fields of predefined structure by means of a set of rules. These fields are also two-dimensional templates, which comprise bars and nodes in typical truss-like arrangement. This means that like a pattern, these fields specify the position in a plane of the profile bar data sets described further below. For overlaying, the set of rules has arrangement routines by means of which, for example, the guideway of the adapted two-dimensional layout is analyzed and distinctive points, for example, the bend points between the horizontal portions and the inclined portion and/or the arc center points in the deflection zones in the case of an escalator, are extracted.

For overlaying, the fields of predefined structure are chosen from a group comprising a standard field, a top bend section, a bottom bend section, a division section or a compensation field. A bend section has an angled leg and a horizontal leg. The set of rules can contain, for example, command lines, which initially specify an arrangement of the two bend sections at the bend points. The bend sections can be aligned on the guideway of the two-dimensional layout. The horizontal legs of the bend sections can then be adapted to the bearing space established in the client-specific configuration data by a displacement of certain nodes and an ensuing lengthening of the bars ending in these nodes. In lieu of a displacement of nodes, for example, it is also possible to add further fields of defined structure to the horizontal leg of a bend section or of both bend sections.

In other words, bearing points can be provided on the two-dimensional layout overlaid with fields, in the regions of the two deflection zones. If after the overlaying with fields a bearing space of the bearing points does not correspond to a required bearing space of the customer-specific configuration data, the bearing space is then enlarged by inserting a further field or by lengthening a field in the region of at least one of the two deflection zones.

The bearing space between the bearing points may be of sufficient length such that a section length stored in the set of rules is not exceeded. For example, this section length takes into account manufacturing technology limits such as a maximum available length of steel profiles or logistics limits such as the usable length of a transport container manufactured according to international standard ISO 668. In the event that the section length is exceeded, enough division points are inserted by the set of rules such that none of the sections exceed the maximum section length. To this end, a division into sections of equal length can take place. However, this is not compulsory. Optionally, the division can also be based on the maximum length of steel profiles or on the usable transport length.

If the set of rules makes provision for a division point, the set of rules automatically integrates a division section aligned with the division point and with the guideway. In this case a division section is a predefined field, which is preferably divided orthogonally to the guideway in a division point.

The two-dimensional layout, which is partially overlaid with fields as described in the preceding, still has gaps between the fields, which whenever possible are overlaid with standard fields by the set of rules, wherein the set of rules fits the standard fields together, aligned with the guideway, in the gaps. Standard fields are fields of equal length and the same structure or same arrangement of nodes and bars. However, it would be purely by chance if the gaps could be completely overlaid by standard fields. As a general rule a remnant gap is left, which is shorter than a standard field. The set of rules fits a compensation field aligned with the guideway into each of these gaps. The structure of nodes and bars of this compensation field is similar to that of a standard field, but is shorter than the standard field.

However, the remnant gap may be so narrow that it is impossible to fit in a suitably dimensioned compensation field. For this case, the set of rules comprises a test routine, with which a minimum length of a compensation field can be checked. If the length of the compensation field is less than the minimum length, the set of rules can connect an adjacent standard field or a half of a division section to the compensation field that has become too short and then subdivided this composite field into two equally long compensation fields.

Owing to the design of the structure, it may be necessary to define at least one division point by a manual input or on the basis of the client-specific configuration data. In this case, the set of rules preferably checks whether the selected division points give rise to sections which exceed the section length stored in the set of rules. If a division point is introduced, a standard field or a compensation field, for example, can be replaced by an equally long division section.

All geometric relationships are known once the two-dimensional, adapted layout has been completely overlaid with fields of defined structure and the required spacing of the bearing points has been achieved, if need be by adding further fields. These relationships serve for calculating the bar forces in the bars of the individual fields by means of the set of rules. To this end, the maximum load to be conveyed acting on the truss and the maximum braking forces and torques acting on the truss can be calculated from, for example, the step width and the conveyor height.

On the basis of the bar forces, a type-specific selection of profile bar datasets can be made for three-dimensional truss model portions, of which the profile bar datasets are arranged according to the bars of the fields and from which the truss dataset to be generated is composed on the basis of the two-dimensional layout overlaid with fields.

In the three-dimensional space, two planes parallel to the plane arranged therein can then be defined, on which planes truss model portions, which in each instance correspond to the structure of the fields and are formed from profile bar datasets, can be fit together along the two-dimensional layout. A three-dimensional truss model portion can have datasets of a top beam portion, of a bottom beam portion, of at least one upright and of at least one diagonal strut, the graphic representations of which are arranged relative to one another according to the structure of the fields in the three-dimensional space.

By fitting the truss model portions together, two three-dimensional truss model side parts arranged parallel to each other are formed in three-dimensional space. The type-specific spacing of these parallel planes or three-dimensional truss model side parts relative to one another can be calculated from the step width using the set of rules. The truss model side parts are three-dimensional graphic representations arranged in the three-dimensional space and can be stored in the computer system as truss side part datasets.

The truss side part datasets arranged parallel relative to each other can then be supplemented, at right angles to their planes, with datasets of transverse struts, transverse floor struts, diagonal floor struts, and end parts with support brackets for the truss dataset, the graphic representation of which is a three-dimensional truss model. To this end, type-specific interface definitions are recorded in the set of rules, which specify the positions of the truss model side parts or in the truss side part datasets where the data sets of transverse struts, transverse floor struts, diagonal floor struts and end parts must be arranged.

As explained in the preceding, the truss model side parts are formed by fitting the fields of corresponding truss model portions together. To optimize future production, the set of rules can then be used to generate one or a plurality of continuous top beam datasets from the top beam portions of the truss model side parts defined by the truss model portions, which will replace the top beam portions in the truss dataset. The ends of the continuous top beam datasets can be defined by the following structural features of fields: a division point of the division section, a bearing point, a bend point of the top or bottom bend section.

In a generic manner, the bottom beam portions of the truss model side parts can also be combined into one or a plurality of continuous bottom beam data sets.

In a further design of the disclosure, the weld seam lengths to be provided in the individual nodes or connection points can be calculated, using the set of rules, on the basis of the computed bar forces and the geometric data of the corresponding truss model portions. Obviously, other connection types can also be calculated, for example, the number and the diameter of screws, rivets or clinch points, if screw connections, clinch connections or rivet connections are provided for connecting the profile bars.

The set of rules can also be used to compare the weld seam length of overlapping, connection point-forming profile bar datasets of a node to the geometric relationships present in this node. For excessively short connection points, provision can be made of a gusset or gusset dataset for the respective nodes.

If need be, the mechanical properties of the truss dataset as a whole can then be checked using static and/or dynamic simulations. One of these dynamic simulations can be, for example, a simulated braking behavior in an escalator. All forces acting on the truss and the forces dependent on the main motor, from the nominal speed to standstill, are simulated herein. Points that are critical to stability can be checked and the dynamic forces acting on the individual profile bars or profile bar datasets during braking can be determined with these simulations. With these simulations, in particular the static and dynamic properties of the truss dataset can be simulated and checked during an earthquake with hypothetical earthquake magnitude and structure movements and if need be, profile bar datasets can be modified and/or further datasets of adapter components for reinforcing the structure thereof can be generated.

In other words, for creating the truss dataset, which was created with the client-specific configuration data taken into account, it is possible to carry out simulations with which static and/or dynamic properties of the commissioned truss can be simulated with the computer system before a corresponding physical truss is produced.

Static simulations analyze a static interaction of a plurality of profile bars, for example. By using static simulations, it is possible to analyze, for example, whether problems may arise in the assembly of a plurality of profile bars with unfavorable summation of manufacturing tolerances.

The set of rules can furthermore contain production-specific data and combine them with the three-dimensional truss dataset. The productions-specific data typically relate to properties or specifications within a manufacturing plant or assembly line in which the truss is to be manufactured.

For example, depending on the country or place where a manufacturing plant is located, different conditions may prevail and/or certain specifications may apply in the manufacturing plant. For example, certain materials, raw materials, raw components or the like may not be available or processed in some manufacturing plants. Machines may be used in some manufacturing plants that are lacking in others. Due to their design, some manufacturing plants are subject to restrictions in terms of the systems for transporting people or components of the same to be manufactured therein. Some manufacturing plants permit a high level of automated production, whereas other manufacturing plants tend to rely on manual production because of lower wage costs, for example. A multiplicity of further conditions and/or specifications, with respect to which production environments can differ, may also exist. All of these production-specific data typically have to be considered for planning or commissioning a truss and ultimately for the escalator or moving walkway as a whole, because how these escalators or walkways can actually be built can depend upon them.

Specific designs of the method for creating a three-dimensional truss dataset of an escalator or moving walkway are presented further below, with reference to preferred embodiments.

Embodiments of the method presented herein can be implemented using a computer system specifically configured for this purpose. The computer system can comprise one or a plurality of computers. In particular, the computer system can be formed from a computer network, which processes data in the form of a cloud. To this end, the computer system can be equipped with a memory, in which it is possible to store the data of the truss dataset, of the profile bar, transverse strut, top beam, bottom beam, diagonal strut, diagonal floor strut, transverse floor strut and upright datasets, data of the set of rules, and also production-specific data in, for example, electronic or magnetic form. The computer system can furthermore be equipped with data processing capabilities. For example, the computer system can have a processor, by means of which data of all of these datasets and of the set of rules can be processed. The computer system can furthermore be equipped with interfaces, via which the data can be entered in the computer system and/or output from the computer system. The computer system can also be implemented in a spatially distributed manner, for example, if data are processed in a cloud distributed over a plurality of computers.

In particular, the computer system can be programmable, for example, prompted by a suitably programmed computer program product to implement or control computer-processable steps and data of the method according to the disclosure. The computer program product can contain instructions or codes which, for example, prompt the processor of the device to generate, store, read out, process, modify, etc., data of the truss dataset. The computer program product can be written in any computer language.

The computer program product can be stored on any computer-readable medium, for example, a flash drive, a CD, a DVD, RAM, ROM, PROM, EPROM, a disc, and so forth. The computer program product and/or the data to be processed therewith can also be stored on a server or on a plurality of servers, for example, in a cloud, from which it can be downloaded via a network, for example, the internet.

In conclusion, it should be pointed out that some of the possible features and advantages of the disclosure are described herein with reference to different embodiments. Persons skilled in the art realize that the features can be combined, transferred, adapted, or exchanged in suitable fashion in order to arrive at further embodiments of the disclosure.

BRIEF DESCRIPTION OF THE DRAWINGS

Embodiments of the disclosure shall be described in the following with reference to the appended drawings, wherein neither the drawings nor the description are to be construed as limiting the disclosure.

FIG. 6 shows the overlay of further fields of defined structure adjoining the bend sections, in order to adapt the two-dimensional layout to the spacing of the bearing points defined in the client-specific configuration data, in a three-dimensional view.

FIG. 7 shows the overlay of the two-dimensional layout adapted in terms of conveyor height with a first field of predefined structure defining a division section, in a three-dimensional view.

The figures are merely schematic and not drawn to scale. The same reference signs designate the same features or features having the same effect in the different figures.

DETAILED DESCRIPTION

Figure 1:
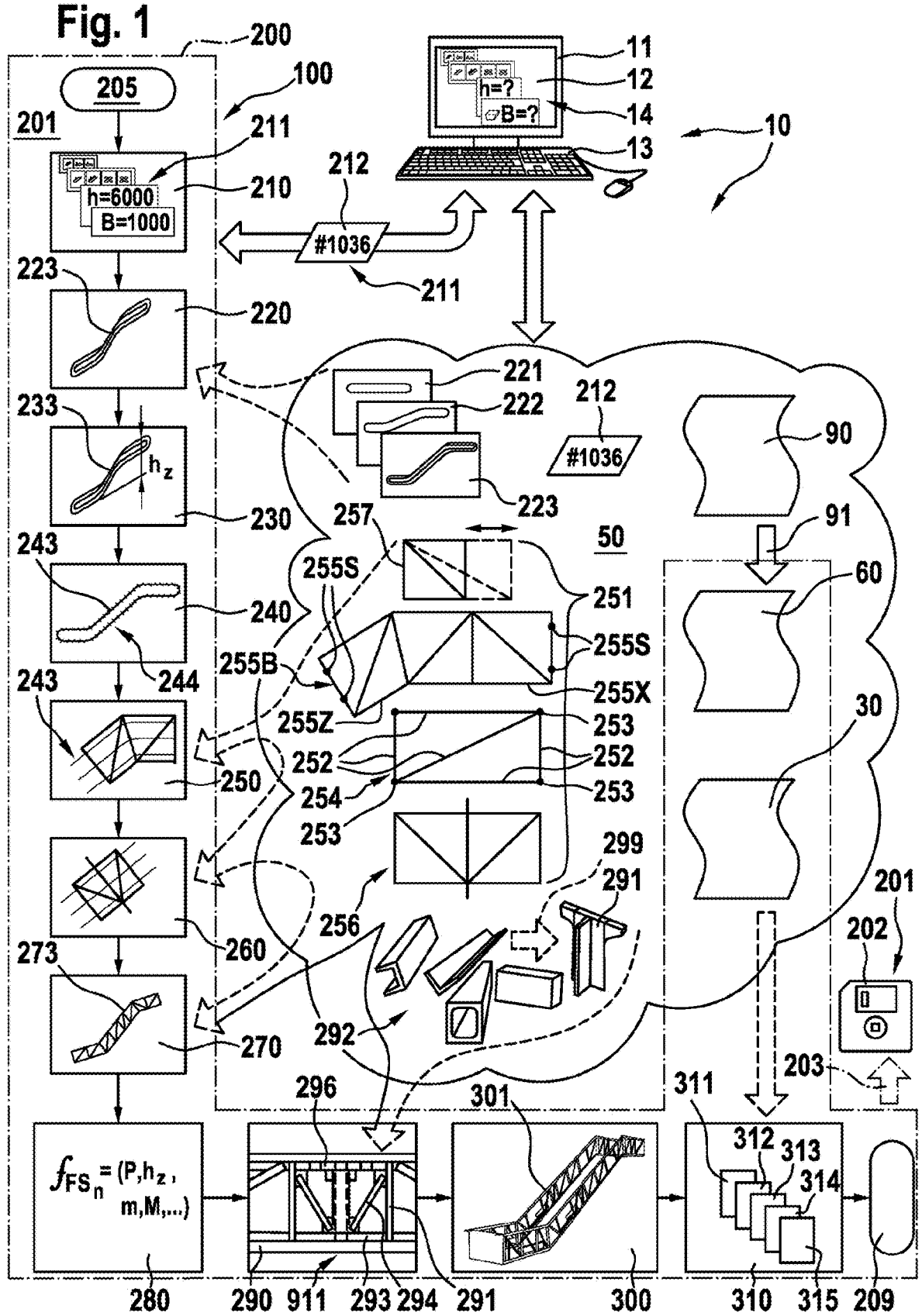
FIG. 1 illustrates, with the aid of a block diagram, the method steps of the method of the disclosure for creating a truss dataset and for carrying out interactions with respect to the datasets accompanying the method.

Some of the method steps 210 to 310 of the method 200 according to the disclosure for creating a three-dimensional truss dataset 301 of an escalator or moving walkway are illustrated in FIG. 1 with the aid of a block diagram 100. For the sake of clarity, the most essential method components, according to some embodiments of the method 200, are outlined with a dashed and dotted line. The method steps 210 to 310 of this method 200 are part of a computer program 201, which can be executed in a computer system 10. The computer system 10 can comprise one or a plurality of computers 11. In particular, the computer system 10 can be formed from a computer network, which processes data in the form of a cloud 50. To this end, the computer system 10 can be equipped with a memory, in which it is possible to store not only the data of the truss dataset 301, but also further data such as profile bar datasets 292, transverse strut, top beam, bottom beam, diagonal strut, diagonal floor strut, transverse floor strut and upright datasets 291, data of a set of rules 60, and also production-specific data 30 in, for example, electronic or magnetic form. The computer system 10 can furthermore be equipped with data processing capabilities. For example, the computer system 10 can have a processor, with which data of all of these datasets and of the set of rules 60 can be processed. The computer system 10 can furthermore be equipped with interfaces 12, 13, via which data can be entered, for example, manually, in the computer system 10 and/or output from the computer system 10. The computer system 10 can also be implemented in a spatially distributed manner, for example, if data are processed in a cloud 50 distributed over a plurality of computers 11.

In particular, the computer system 10 can be programmable, for example, prompted by the suitably programmed computer program 201 or computer program product to implement or control computer-processable steps and data of the method 200 according to the disclosure. The computer program 201 can contain instructions or codes which, for example, prompt the processor of the computer system 10 to generate, store, read out, process, modify, etc., data of the truss dataset 301. The computer program 201 can be written in any computer language.

The computer program 201 can be stored, as represented symbolically by the dashed and dotted arrow 203, as a computer program product on any computer-readable medium 202, for example, a flash drive, a disc, a CD, a DVD, RAM, ROM, PROM, EPROM, and so forth. The computer program 201 and/or the data to be processed therewith can also be stored on a server or on a plurality of servers, for example, in the cloud 50, from which it can be downloaded via a network, for example, the internet.

The method steps 210 to 310 can carried out by means of the computer program 201, wherein these steps can be executed in the illustrated sequence, but do not have to be executed in this sequence. In particular, it is also possible to carry out certain method steps 210 to 310 (for example, the method steps of overlaying fields of defined structure in an overlaying method step 250 and the insertion of division sections in a division section method step 260) in parallel, provided that the computing power of the computer system 10 permits this. In addition, overarching iterative loops may be required for some method steps 210 to 310, in particular if static and dynamic calculations are involved, which for the sake of clarity are symbolically amalgamated in a calculation method step 280.

From the program start 205, client-specific configuration data 211 containing information on at least the step width B and the conveyor height $h_Z$ are determined in a configuration method step 210. To this end, the computer program 201 can perform steps that generate input masks 14 with input fields on a screen 12 and optionally query the step width B and conveyor height $h_Z$ desired by the client directly. Obviously, it is also possible to query other client-specific configuration data 211, from which the step width B and the conveyor height $h_Z$ can be determined by suitable program routines.

Optionally, a logfile 212 provided by the client can be accessed by the computer program 210, in order to extract appropriate data from this logfile 212. Such a logfile 212 can be generated by, for example, the client by means of a program that provides the client with a so-called BIM (Building Information Model). Such BIMs are digital three-dimensional shell models of escalators or moving walkways, which are configured by the client by means of inputs and which the client can then incorporate in the client's digital three-dimensional building model.

In a layout method step 220, the computer program 201 can propose a type-specific two-dimensional layout 221, 222, 223 based on the client-specific configuration data 211. Obviously, the user can also select a type-specific two-dimensional layout 221, 222, 223 by means of an entry.

Type-specific, two-dimensional layouts 221, 222, 223 reproduce the product-specific nature of a product series. This means that it is particularly evident therefrom whether it is a two-dimensional layout of a horizontal moving walkway 221, a two-dimensional layout of an inclined moving walkway 222 or a two-dimensional layout of an escalator 223. Obviously, still further layouts of each of these "basic layouts" are possible; depending on the number of different products, a corresponding number of two-dimensional layouts, in particular of an escalator, are possible. Two escalator types having different slope angles of the middle part can serve as an example of this, a two-dimensional layout being available for each of these two escalator types. In the present exemplary embodiment of FIG. 1, the two-dimensional layout of an escalator 223 was selected. More detailed explanations of the two-dimensional layouts 221, 222, 223 are given further below in the description of FIG. 2, also with reference to the two-dimensional layout of an escalator 223.

The selected two-dimensional layout 221, 222, 223 is merely a template, which has to be adapted to the client-specific configuration data 211, in particular to the conveyor height $h_Z$. This adaptation method step 230 leads to the adapted, two-dimensional layout 233. More detailed explanations of the adaptation of the selected two-dimensional layout 223 depicted in FIG. 2 to achieve the adapted two-dimensional layout 233 are given further below in the description of FIG. 3.

In an initial recording 240, the guideway of the layout 233 adapted in terms of the conveyor height in the preceding method step is subdivided into division portions 244. The purpose of this subdivision is so that the physical truss eventually produced on the basis of the truss dataset 301 has sufficient space available for accommodating a step band or the revolving conveyor chain 21 thereof (see FIG. 4). More detailed explanations on the subdividing of the adapted two-dimensional layout 233 in FIG. 3 to achieve the subdivided, two-dimensional layout 243 with a subdivided guideway are given further below in the description of FIG. 4.

In an overlay method step 250, fields 251 of predefined structure can be then overlaid, by means of the set of rules 60, on the subdivided two-dimensional layout 243. These fields 251 are also two-dimensional templates, which comprise bars 252 and nodes 253 (reference sign only given for the standard field 254) in typical truss-like arrangement. This means that each of these fields 251, in the manner of a cut pattern, specifies the position, in the plane, of the profile bar datasets 292 and the transverse strut, top beam, bottom beam, diagonal strut, diagonal floor strut, transverse floor strut and upright datasets 291 described further below. More detailed explanations of the overlay method step 250 are given in the description of FIGS. 5 to 8.

Because of the design of the structure or the existing transport capacity, it may be important to define, in a division point method step 260, at least one division section 256 by manual input or on the basis of the client-specific configuration data 11. More detailed explanations of the division point method step 260 are given further below in the description of FIGS. 7 and 8.

After the subdivided two-dimensional layout has been overlaid with the specifically designed fields 251 of defined structure such as bend sections 255A, 255B and the division sections 256, for example, the zones of the layout 243 that have not yet been overlaid are then completely overlaid, in a completion method step 270, with fields 251 of designed structure, in particular with standard fields 254 and compensation fields 257. The overlaid two-dimensional layout 273 thus created then has all geometric relationships in the plane of a truss side part, which is described in more detail in FIGS. 9 and 10. More detailed explanations of the completion method step 270 are given further below in the description, in particular with regard to FIGS. 7 and 8.

The geometric relationships defined by the fields are used in a calculation method step 280 for calculating the bar forces $F_{Sa}$ in the bars of the individual fields 251 by means of the set of rules 60. To this end, for example, the maximum weight (mass) m to be conveyed and acting on the truss or truss dataset 301 thereof and the maximum braking forces P and torques M acting on the truss can be calculated from the step width B and the conveyor height $h_Z$, supplemented by further data such as those from sets of standards 90. The individual bar forces $F_{sa}$ can then be calculated, according to the geometrical arrangement thereof in the fields 251, using the calculation methods known from engineering mechanics and materials science or using finite element calculation programs.

Figure 9:
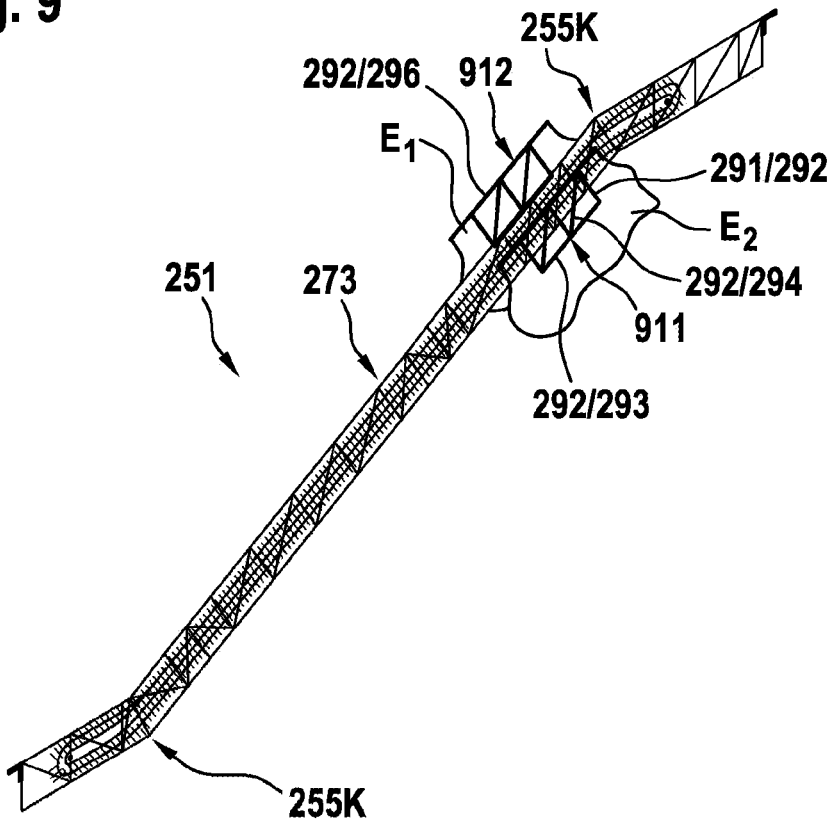
FIG. 9 shows the beginning construction of two truss model side parts with three-dimensional truss model portions or profile datasets in two planes parallel to the two-dimensional layout, in a three-dimensional view.
Figure 10:
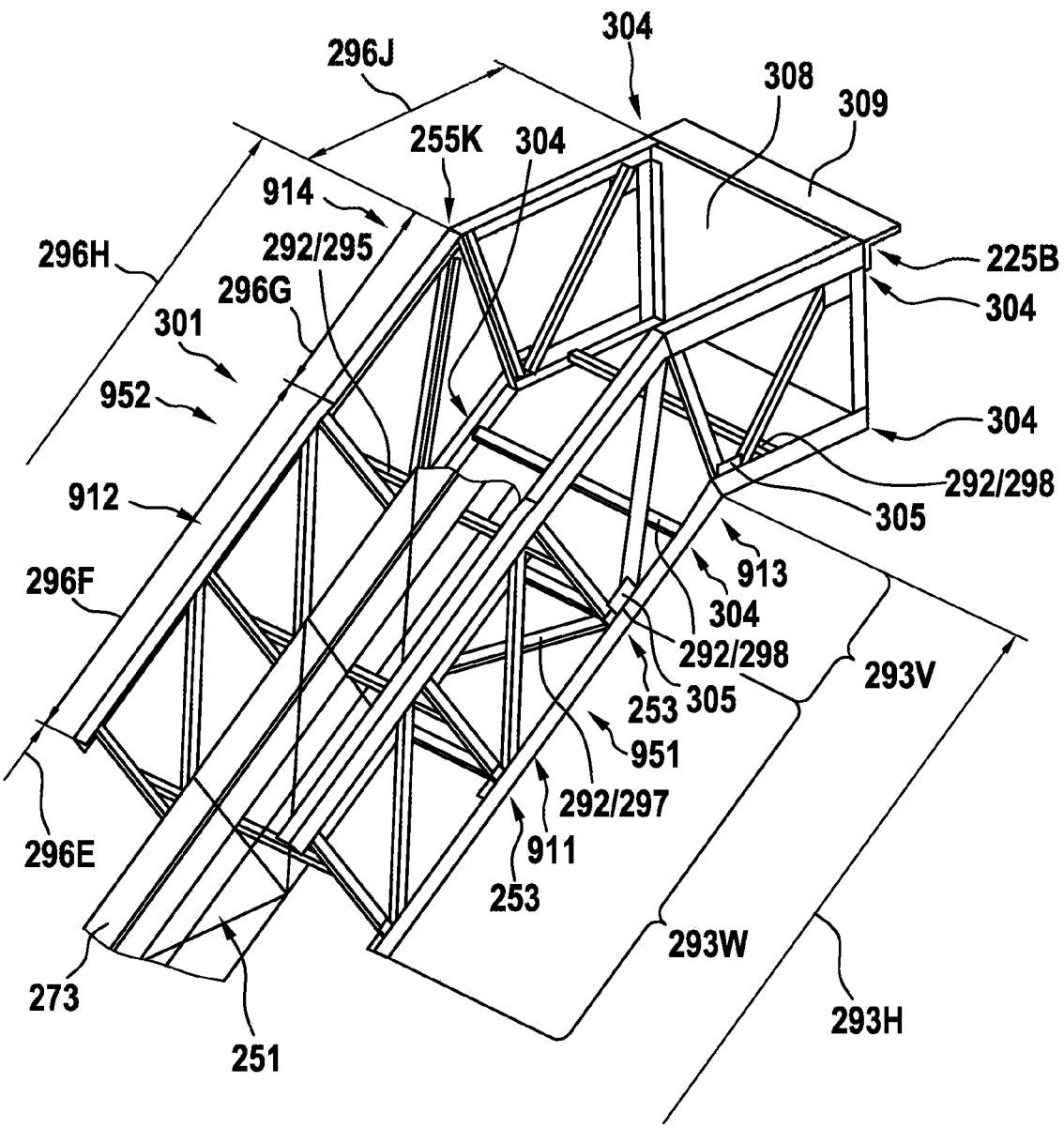
FIG. 10 shows the truss model portion depicted in FIG. 9 and a truss model portion of a bend section adjoining the same, in magnified form.

In the selection method step 290, the bar forces $F_{Sa}$ can be used as a basis for making a type-specific selection of profile bar datasets 292, in particular for upright datasets 291, top beam datasets 296, bottom beam datasets 293, diagonal strut datasets 294, transverse strut datasets, transverse floor strut datasets, diagonal floor strut datasets and gusset datasets. As indicated by the arrow 299, the upright datasets 291 are also composed of profile bar datasets 292. As illustrated in FIGS. 9 and 10, truss model portions 911, 912 913, 914, are generated from these datasets, the profile bar datasets 292 of which are arranged according to the bars of the fields 251 and interconnected in the nodes 253 and from which the truss dataset 301 to be generated is composed on the basis of the two-dimensional layout 273 overlaid with fields 251. The connection means to be provided in the nodes 253 (e.g., weld seams, rivets, fitting screws, clinch points, and so forth) are calculated and defined on the basis of the individual bar forces $F_{Sa}$.

Because the selection is also influenced by applicable sets of standards 90 such as EN115-1, these sets of standards also impact the set of rules 60, as symbolically represented by the arrow 91. More detailed explanations of the selection method step 270 are given further below in the description, in particular with regard to FIGS. 9 and 10.

Once the truss dataset 301 has been assembled from the truss model portions and further profile bar datasets 292 in the manner represented in the completion method step 300, if need be the mechanical properties of the truss dataset 301 as a whole can be checked by the set of rules 60 using static and/or dynamic simulations, for example.

For example, static simulations analyze a static interaction of a plurality of profile bar datasets 292. By using static simulations, it is possible to analyze, for example, whether problems may arise in the assembly of a plurality of profile bars with unfavorable summation of manufacturing tolerances.

One of the dynamic simulations can be, for example, a simulated braking behavior in a fully loaded escalator. All forces acting on the truss or on the underlying truss dataset 301 thereof ranging from nominal speed to standstill and the forces that must be borne by the main motor are simulated herein. Optionally, the truss dataset 301 can be integrated, in the sense of an in-the-loop approach, in a comparable, already existing digital twin of an existing escalator, with which static and dynamic forces and torques can be checked and calculated.

Points that are critical to stability can be located and checked, and the dynamic forces acting on the individual profile bars or profile bar datasets 292 during operation, during startup and braking, and during unusual operation states can be determined on the basis of these simulations. In particular, the static and dynamic properties of the truss dataset 301 can be simulated and checked during an earthquake with hypothetical magnitude and structure movements, and if need be profile bar datasets 292 can be modified and/or further datasets of adapter components for reinforcing the structure of the truss dataset 301 can be generated.

In other words, for the creation of the truss dataset 301, which was created with the client-specific configuration data 211 taken into account, it is possible to perform simulations with which static and/or dynamic properties of the commissioned truss are simulated with the computer system 10 prior to producing a corresponding physical truss.

In principle, the method 211 according to the disclosure could be concluded with the completion method step 300. However, the calculations of the truss dataset 301 are based on hypothetical material data. In order to obtain an even more precise truss dataset 301, the set of rules 60 can access or even contain production-specific data 30 and combine them with the three-dimensional truss data set 301 in the scope of a production preparation method step 310. The production-specific data 30 typically relate to properties or specifications within a manufacturing plant or assembly line in which the physical truss is to be produced on the basis of the truss dataset 301.

For example, depending on the country or place where a manufacturing plant is located, different conditions may prevail and/or certain specifications may apply in the manufacturing plant. For example, certain materials, raw materials, raw components or the like may not be available or processed in some manufacturing plants. Machines may be used in some manufacturing plants that are lacking in others. Due to their design, some manufacturing plants are subject to restrictions in terms of the systems for transporting people or components of the same to be manufactured therein. Some manufacturing plants permit a high level of automated production, whereas other manufacturing plants tend to rely on manual production because of lower wage costs, for example. A multiplicity of further conditions and/or specifications may exist, in terms of which manufacturing environments can differ. All of these production-specific data typically have to be considered for planning or commissioning a truss and ultimately for the escalator or moving walkway as a whole, because how the escalator or walkway can actually be built can depend upon them.

In the context of interlinking the truss dataset 301 and the production-specific data 30, a multiplicity of documents such as parts lists 311, shop drawings with tolerance and manufacturing specifications 312, production programs for production machines 313, data for cost calculations 314, data for production planning systems 315 and so forth can be generated. If need be, in particular the material data of the individual profile bar datasets 292 can be changed thereby. These material data are preferably transferred as characterizing properties to the relevant profile bar datasets 292 of the truss dataset 301 and if need be, static and dynamic simulations are performed again with this elaborated truss dataset 301.

The outcome at the end of the program 209 is a complete truss dataset 301, the virtual representation of which is a three-dimensional model of the commissioned truss to be produced. In addition, all production-relevant data and documents may also be present if the production preparation method step 310 was performed.

Figure 2:
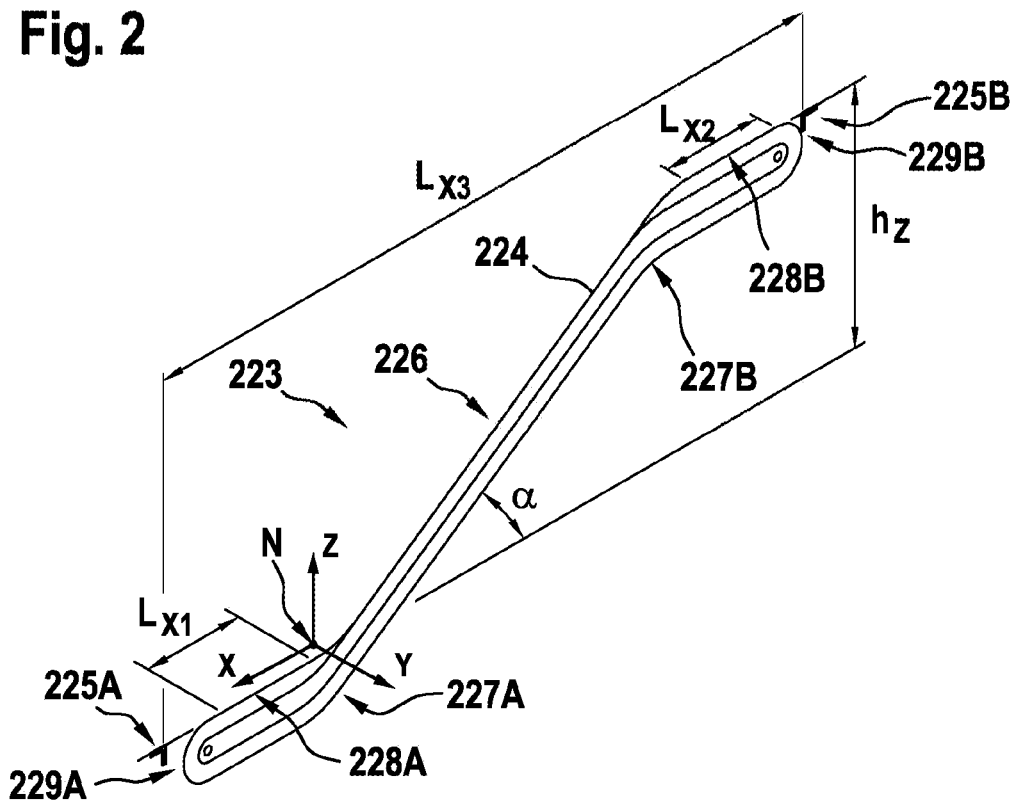
FIG. 2 shows a type-specific two-dimensional layout in a three-dimensional view.

As has already been explained with respect to FIG. 1, FIG. 2 shows a type-specific two-dimensional layout of an escalator 223, in a three-dimensional view. This two-dimensional layout 223 essentially shows the guideway 224 of a not illustrated step band, the revolving conveyor chain thereof and a defined origin N. For example, all adaptations of the two-dimensional layout 223 can be made starting from this origin N.

In a sense, the two-dimensional layout 223 is a template that is characteristic for a certain escalator or moving walkway type. To optimize the effort in terms of production engineering, products are developed as so-called types. This means that a certain escalator type, for example, is designed for conveyor heights up to six meters, whereas another escalator type is designed for conveyor heights up to thirty meters. The type-specific, two-dimensional layouts 223 of these two escalator types differ from one another in terms of, for example, the permissible slope α of the guideway 224 in the inclined portion 226 of the escalator, in the transition curves 227A, 227B of the guideway 224, and in the length $L_{X1}$, $L_{X2}$ of the horizontal portions 228A, 228B of the guideway 224. The latter are arranged in the access zones 229A, 229B adjoining both ends of the inclined portion 226. When features are designated as "type-specific" in the following, these features are always consistent with the corresponding type-specific two-dimensional layout 223.

The position indications "horizontal," "vertical" and "inclined" used in this description always refer to the planned installation situation in a structure of the truss to be produced. The indexes of the measurements are in accordance with the orientation thereof in the three-dimensional space, in accordance with the Cartesian coordinate system specified for the origin N. The feature conveyor height $h_Z$ furthermore relates to the vertical distance between the two bearing points 225A, 225B arranged in the access zones 229A, 229B, whereas the feature bearing space $L_{X3}$ refers to the horizontal distance between the two bearing points 225A, 225B.

In other words, the two-dimensional layout 223 is a side view of the guideway 224 of the step band or of the components thereof such as a conveyor chain 21 (see FIG. 4), as specified in a type-specific manner for a physical escalator or for a physical moving walkway by the guide tracks thereof.

Obviously, the type-specific two-dimensional layout 233 can also be selected by a manual input, wherein the computer program 200 preferably checks whether the product on which the selected two-dimensional layout 223 is based can comply with certain client-specific configuration data 211 such as the bearing space $L_{X3}$ or the conveyor height $h_Z$.

Figure 3:
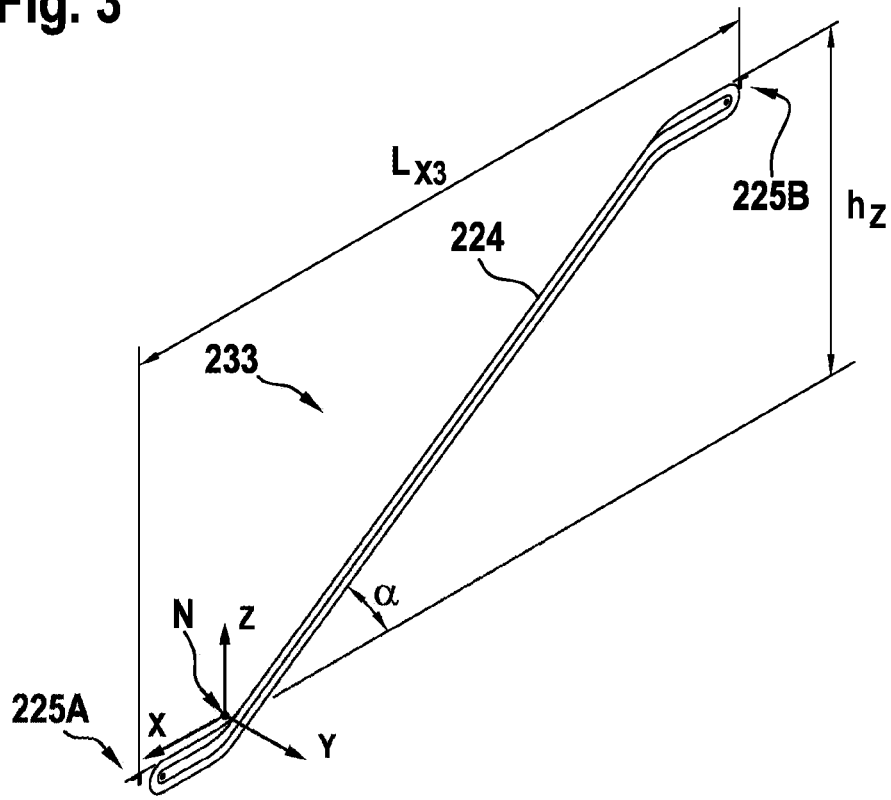
FIG. 3 shows the type-specific two-dimensional layout adapted in terms of a specified conveyor height, in a three-dimensional view.

As already explained with respect to FIG. 1, FIG. 3 shows an adapted two-dimensional layout 233 in a three-dimensional view. The two-dimensional layout 233 proposed in accordance with FIG. 2 or selected by manual input is a template that defines the desired product type or desired product, but still does not satisfy the client-specific requirements 211. In the adaptation method step 230 in particular, the selected two-dimensional layout 223 of FIG. 2 is adapted in terms of the conveyor height $h_Z$ while maintaining the slope α. The adaptation can be made starting from the origin N, although it is also possible to define other points such as the bearing points 255A, 255B or points in the two-dimensional layout 233, which can be used for adapting the conveyor height $h_Z$. As a result, the two-dimensional layout 233 adapted in this manner logically also has a greater bearing space $L_{X3}$ between the bearing points 225A, 225B and a longer guideway 24 than does the originally selected template. Since the two access zones are always arranged on the same horizontal plane in two-dimensional layouts of horizontal moving walkways 221, an adaptation of a conveyor height $h_Z$ is logically omitted.

Figure 4:
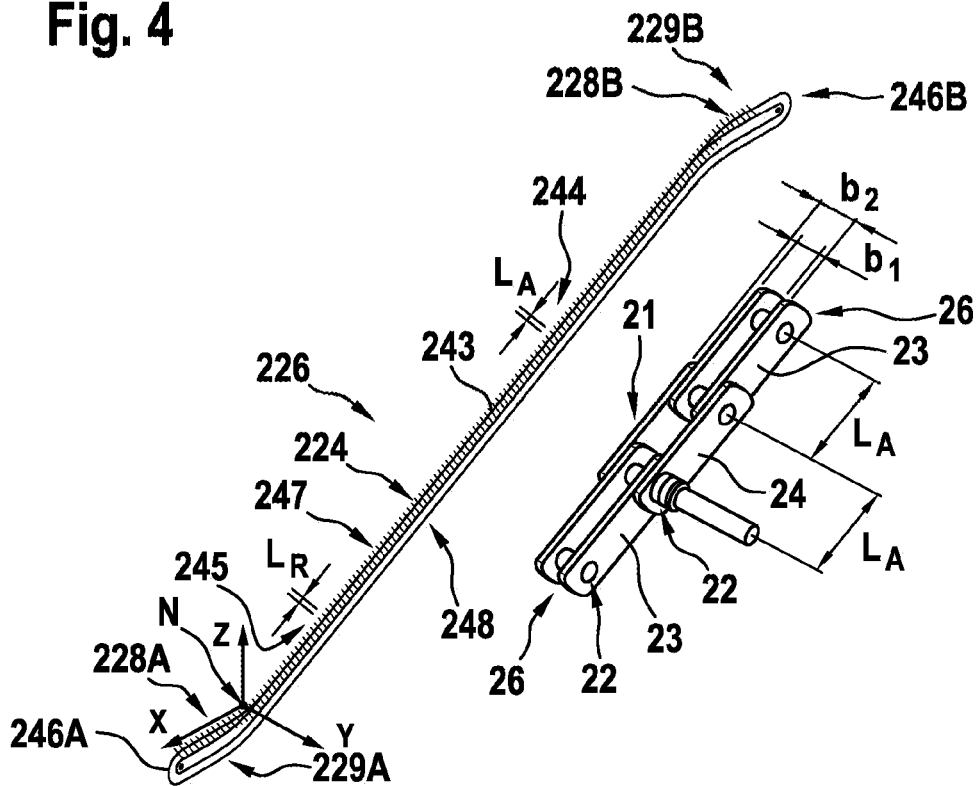
FIG. 4 shows the subdivision of the two-dimensional layout adapted in terms of conveyor height in a three-dimensional view.

As has already been explained with respect to FIG. 1, FIG. 4 shows a subdivided two-dimensional layout 243 in a three-dimensional view. This is achievable by subdividing the guideway 224 of the two-dimensional layout 233, which was adapted in terms of the conveyor height according to FIG. 3 into division portions 244 by the initial recording 240.

The length $L_A$ of the division portions 244 corresponds to the spacing of two sequential hinge points 22 of a type-specific conveyor chain 21, which is shown in substantially enlarged view in FIG. 4 for the sake of clarity. It is possible for a remnant division portion 245 to be left, the remnant length $L_R$ of which is less than the length $L_A$ of all other division portions 244. A type-specific conveyor chain 21 is the conveyor chain 21 that is provided for the respective escalator or moving walkway types on which the two-dimensional layout 223 or adapted two-dimensional layout 233 or subdivided two-dimensional layout 243 is based.

If there is a remnant division portion 245, the guideway 224 is then enlarged in terms of its circumferential length until the remnant division portion 245 has the same length $L_A$ as the rest of the division portions 244. Only thus is it possible to arrange a type-specific conveyor chain 21 having only entire chain plates 23, 24 (or more precisely chain plates 23, 24 with identical gauge) in a revolving manner on the guideway 224, without having to use a provided clamping area of the conveyor chain 21.

Because a conveyor chain is typically composed of narrow chain links 23 with a link width b1 and wide chain links 24 with a link width b2, the ends 26 of such a conveyor chain 21 can only be connected to one another if a narrow chain link 23 meets a wide chain link 24 at the junction point configured as a hinge point 22. This condition is contingent upon an even number of division portions 244 or hinge points 22. In the case of an odd number of division portions 244, the circumferential length of the guideway 224 can therefore be lengthened by a further division portion 244 in a further method step.

Basically, the guideway 244 has two deflection zones 246A, 246B arranged in the access zones 229A, 229B and a forward run portion 247 and a return portion 248 between the deflection zones 246A, 246B. In the case of two-dimensional layouts 222, 223 of escalators or inclined moving walkways, the deflection zones 246A, 246B are arranged in the above-mentioned horizontal portions of the access zones 228A, 228B (also see FIG. 2). The forward run portion 247 and the return portion 248 extend in the horizontal portions 228A, 228B, in the inclined portion 226 and in the transition curves 227A, 227B between the horizontal portions 228A, 228B and the inclined portion 226. In the case of two-dimensional layouts 221 of horizontal moving walkways 221, the deflection zones 246A, 246B are also arranged in the access zones 229A, 229B, and the forward run portion 247 and the return portion 248 extend horizontally between the two deflection zones 246A, 246B. To enlarge the guideway 244, the forward run portion 247 and the return portion 248 can be lengthened by linearly displacing one of the two deflection zones 246A, 246B in escalators and inclined moving walkways while maintaining the conveyor height $h_Z$ and starting, for example, from the origin N.

Or to put it another way, one or both deflection zones 246A, 246B are shifted horizontally until the remnant division portion 245 has the same length as the other division portions 244 and, if provision is made of a conveyor chain 21 having wide chain links 24 and narrow chain links 23, the entire guideway 224 can be divided into an even number of division portions 244. Although FIG. 4 shows the initial recording 240 of the guideway 224 on the basis of a two-dimensional layout of a moving walkway 243, the initial recording 240 can also be used for a two-dimensional layout of a horizontal moving walkway 221, once the changes have been made.

As has already been explained with respect to FIG. 1, FIGS. 5 through 8 show the overlay method step 250 on the basis of the subdivided two-dimensional layout 243 from FIG. 4. For overlaying, the set of rules 60 illustrated in FIG. 1 has arrangement routines, by means of which, for example, the guideway 224 of the subdivided two-dimensional layout 243 is analyzed and distinctive points are extracted. In the present exemplary embodiment of FIG. 5, these could be the interfaces or bend points 255K between the horizontal portions 228A, 228B and the inclined portion 226 and/or the arc center points M in the deflection zones 246A, 246B.

For overlaying, the fields 251 of predefined structure (also see FIG. 1) are selected from, for example, a group comprising a standard field 254, a top bend section 255B, a bottom bend section 255A, a division section 256 or a compensation field 257. Optionally, still further fields 251 of predefined structure may be present. A bend section 255A, 255B has an inclined leg 255Z and a horizontal leg 255Y.

Figure 5:
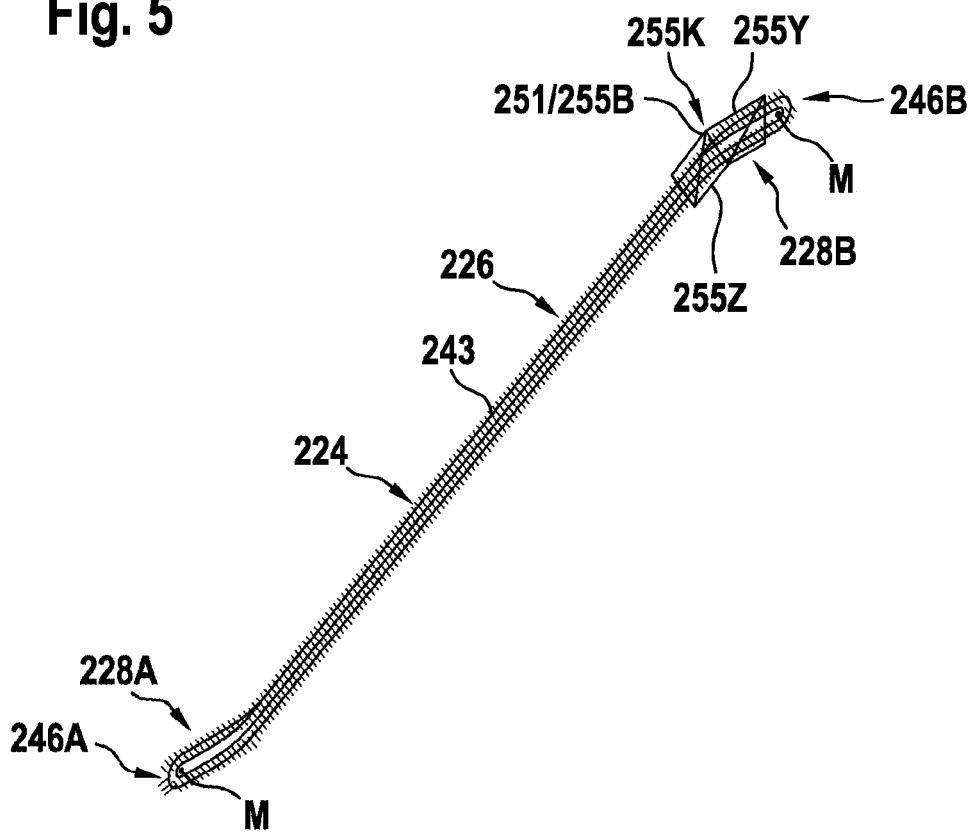
FIG. 5 shows the overlay of the two-dimensional layout adapted in terms of conveyor height with a first field of predefined structure defining a bend section, in a three-dimensional view.

The set of rules 60 can contain, for example, command lines, which initially specify an arrangement of the two bend sections 255A, 255B at the bend points 255K, as illustrated in FIGS. 5 and 6. The bend sections 255A, 255B can have guide alignment points 255S (see FIG. 1), which are aligned with the guideway 224 of the subdivided two-dimensional layout 243.

As illustrated in FIG. 6 using the bend section 255A arranged in the bottom access zone as an example, the horizontal legs 255X of the bend sections 255A, 255B can be adapted to the bearing space $L_{X3}$ defined in the client-specific configuration data 211 by shifting certain nodes 255K, 255L by an extension distance ΔL to a calculated node position 255K', 255L' and by an accompanying lengthening of the bars 255G, 255H that end in these new node positions 255K', 255L'. This shifting of the nodes 255K, 255L to the new node positions 255K', 255L' can occur starting from, for example, the origin N. In lieu of a shifting of nodes 255K, 255L, it is also possible to add, for example, fields of defined structure 251 to the horizontal legs 255X, for example, by adding a standard field 254 and a compensation field 257 as illustrated with reference to the top bend section 255B.

In other words, bearing points 225A, 225B are provided on the two-dimensional layout 243 overlaid with fields 251, in the regions of the two deflection zones 246A, 246B. Should a bearing space of the bearing points not correspond to a specified bearing space $L_{X3}$ of the client-specific configuration data 211 after the overlaying of the fields 251, the bearing space is enlarged by inserting a further field 251 or by lengthening a field 251 in the region of at least one of the two deflection zones 246A, 246B.

As illustrated in FIG. 7, the bearing space $L_{X3}$ between the bearing points 225A, 225B can be of sufficient length such that a default section length $L_{XS}$ in the set of rules 60 is exceeded. This section length $L_{XS}$ takes into account, for example, production engineering limits such as a maximum available length of steel profile portions or logistics limits such as the usable length of a transport container manufactured according to the international standard ISO 668. If the section length $L_{XS}$ is exceeded, as many division points 259 can be inserted by the set of rules 60 as needed so that none of the sections exceed the maximum section length $L_{XS}$. A division into equally long sections can be performed. However, this is not compulsory. Optionally, the division can also be according to the maximum length of steel profile sections or the usable transport length.

If the set of rules 60 makes provision for a division point 259, a division section 256 aligned with the division point 259 and with the guideway 224 can automatically be inserted there by the set of rules 60. A division section 256 is a predefined field 251 that is preferably divided orthogonally to the guideway 224 in the division point 259.

The two-dimensional layout 243 described in the preceding and partially overlaid with fields 251 still has gaps $T_1$, $T_2$ between the already inserted fields 251, which are overlaid whenever possible with standard fields 254 by the set of rules 60.

Figure 8:
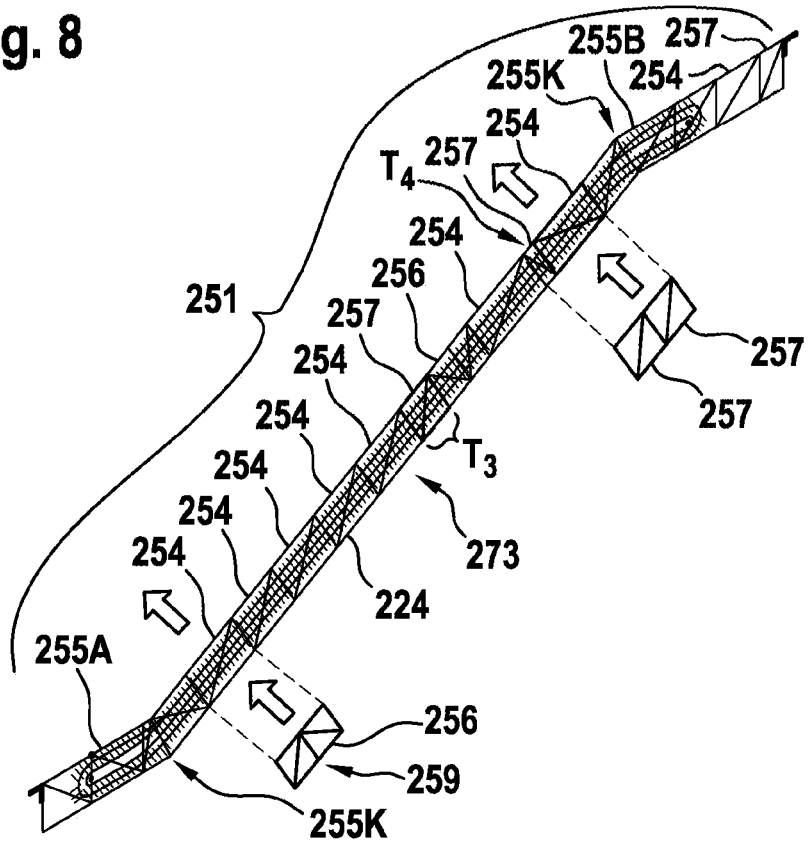
FIG. 8 shows the two-dimensional layout adapted in terms of conveyor height and completely overlaid with fields of defined structure, in a three-dimensional view.

As also illustrated in FIG. 8, the set of rules 60 arranges the standard fields 254 one after another in the gaps $T_1$, $T_2$ and aligns them with the guideway 224. Standard fields 254 are fields 251 of equal length and with the same structure or same arrangement of nodes 253 and bars 252. However, it would be purely by chance if the gaps $T_1$, $T_2$ could be overlaid completely with standard fields 254. A remnant gap $T_3$, $T_4$, which is shorter than a standard field 254, generally remains. The set of rules 60 fits a compensation field 257 aligned with the guideway 224 in every one of these gaps $T_3$, $T_4$. Its structure of nodes 253 and bars 252 is the same as that of a standard field 254, but it is shorter than the standard field 254.

FIG. 8 shows the two-dimensional layout 273 completely overlaid with fields 251 of defined structure. However, the remnant gap $T_3$, $T_4$ may be so narrow that a suitably dimensioned compensation field 257 cannot be fit in. For this case, which is illustrated by the remnant gap $T_4$, the set of rules 60 comprises a test routine with which a minimum length of a compensation field 257 can be checked. If the minimum length thereof is not achieved, the set of rules 60 can combine or merge an adjacent standard field 254 or an adjacent half of a division section 256 with the compensation field 257 that has become too short and then subdivide this combined field into two equally long compensation fields 257.

Even after the two-dimensional layout 273 has been completely overlaid with fields 251, obviously it is still possible to insert a division point 259 by manual input. As FIG. 8 shows, in doing so a standard field 254 is replaced by a division section 256 of equal length. The set of rules 60 preferably checks whether the selected division points 259 give rise to sections that exceed the default section length $L_{XS}$ in the set of rules. It is also possible to replace division sections 256 proposed by the set of rules 60 with standard fields 254 by means of a manual input, wherein the computer program can emit a corresponding visual and/or acoustic warning if the section length $L_{XS}$ is exceeded.

As illustrated in FIG. 9, two planes E1, E2 parallel to the plane of the two-dimensional layout 273 arranged in the three-dimensional space can then be defined therein, wherein the set of rules 60 can be used to calculate the type-specific spacing of these parallel planes E1, E2 from the specified step width B (see FIG. 1). Three-dimensional truss model portions 911, 912, which in each case follow the defined structure of the fields 251 and are formed from profile bar datasets 292, can be arranged on the two planes E1, E2.

A three-dimensional truss model portion 911, 912 can have datasets of a top beam portion 296, of a bottom beam portion 293, of at least one upright 291 and of at least one diagonal strut 294, the graphic representations of which are arranged relative to one another in accordance with the structure of the fields 251 on the two planes E1, E2 in the three-dimensional space.

As illustrated in FIG. 10, the individual truss model portions 911, 912, 913, 914 are fit together along the two-dimensional layout 273 on the two planes E1, E2, which were not drawn in FIG. 10 for the sake of clarity. As a result, two three-dimensional truss model side parts arranged parallel relative to each other are formed in the three-dimensional space, which are only reproduced partially in FIG. 10. The truss model side parts are three-dimensional graphic representations, arranged in the three-dimensional space, of the truss side part datasets 951, 952 assembled from the profile bar datasets 292. They can also be stored in the computer system 10.

The truss side part datasets 951, 952 arranged parallel relative to one another can then be supplemented, orthogonally to their planes, by means of profile bar datasets 292, or to put it more precisely, by means of transverse strut datasets 295, transverse floor strut datasets 298, diagonal floor strut datasets 297 and end part datasets 308 with support bracket datasets 309 for the truss dataset 301, the graphic representation of which is a three-dimensional truss model. To this end, type-specific interface definitions are recorded in the set of rules 60, which specify which connection points 304 and nodes 253 of the truss model side parts or of the truss model side part datasets 951, 952 with the transverse strut datasets 295, transverse floor strut datasets 298, diagonal floor strut datasets 297 and end part datasets 308 have to be interconnected.

As explained above, the truss model side parts or truss model side part datasets 951, 952 are formed by joining the fields 251 of corresponding truss model portions 911, 912, 913, 914 to one another. To optimize an eventual production, one or a plurality of continuous top beam datasets 296H, which will replace the top beam portions 296E, 296F, 296G in the truss dataset 301, can then be generated by means of the set of rules 60 from the top beam portions 296E, 296F, 296G of the truss side part datasets 951, 952 defined by the truss model portions 911, 912, 913, 914. The ends of the continuous top beam datasets 296H, 296J can be defined by the following structural features of fields 251: a division point 259 of the division section 256, a bearing point 225A, 225B, a bend point 255K of the top bend section 255B or bottom bend section 255A.

In a generic manner, the bottom beam portions 293V, 293W (for the sake of clarity, only two bottom beam portions are designated by a reference sign) of the truss side part datasets 951, 952 can be amalgamated into one or a plurality of continuous bottom beam datasets 293H.

In this description, the feature "continuous" is understood to mean a profile bar in the form of a continuous single piece defined by the continuous top beam or bottom beam dataset. Essentially, this means that individual top beam or bottom beam portions do not have to be sawed from a long profile bar semifinish and that the individual portions do not have to be welded back together, but that the lengths of the portions are summed and then a profile bar of corresponding length is sawed from the profile bar semifinish. This can cut back considerably on the amount of sawing and welding work during the subsequent production.

As already mentioned, the set of rules 60 can be used to compare the required weld seam lengths of overlapping profile bars of a node 253 or connection point 304 that need to be provided with the existing geometric relationships in this node 253 or in this connection point 304 on the basis of the calculated bar forces $F_{Sa}$ and the geometric data of the corresponding truss model portions 911, 912, 913, 914. In the event of insufficient overlap, provision can be made of a gusset or gusset dataset 305 for the node 253 or connection point 304 concerned.

Obviously, it is also possible to calculate other connection types, for example, the number and the diameter of screws, rivets or clinch points if screw connections, clinch connections or rivet connections are provided in the nodes 253 or connection points 304 for connecting the profile bars.

From the preceding embodiments, it is clear that the set of rules 60 is an elaborate computer program or elaborate part of the computer program 201 rather than a simple formula. For example, a database can be integrated in the set of rules 60, in which the material parameters of the materials available in diverse production countries, the production means available at the individual production sites such as the available machinery and so forth, are recorded. However, a multiplicity of algorithms for the geometric analysis of the guideway 224, calculation methods from the fields of physics, engineering mechanics and materials science for static and dynamic analysis of the truss dataset, and stochastic calculation methods can be implemented. Obviously, the set of rules 60 can also include rules for accessing external computer programs and databases from which these algorithms, calculation programs such as a finite elements program, and so forth can be retrieved. The calculation bases that may be used from the set of rules 60 with its characteristic properties are preferably stored in the individual fields 251.

Because the truss dataset 301 is a virtual digital copy of the actual physical truss produced according to this dataset, this dataset can be integrated in a so-called digital twin, which in turn is a virtual copy of the physical escalator or moving walkway configured by the client-specific configuration data. The digital twin provides an excellent simulation platform for analyzing operating parameters of the associated physical escalator or of the associated physical moving walkway recorded by sensors. The simulations enable conclusions to be drawn regarding the current state of the escalator or moving walkway, in particular conclusions regarding maintenance or repairs that may be needed.

Although this disclosure was described in detail in FIGS. 1 through 10 using a truss dataset 301 of an escalator as an example, it is obvious that the described method steps and the corresponding computer system 10 apply equally to moving walkways. The arrangement of the profile bar datasets 292 in the three-dimensional space was described on the basis of two planes E1, E2. This is not a mandatory approach, as spatial coordinates starting from the origin N of all profile bar datasets 292 can also be calculated such that the latter can be arranged with respect to the origin N. Also conceivable are solutions with auxiliary origins for each field 251, on the basis of which the profile bar datasets are arranged.

In conclusion, it should be noted that terms such as "having," "comprising," etc. do not exclude other elements or steps, and terms such "one" or "a/an" do not exclude a multiplicity. It should furthermore be noted that features or steps that were described with reference to one of the above exemplary embodiments can also be used in combination with other features or steps of other exemplary embodiments described above. Reference signs in the claims are not to be construed as limiting.

The invention claimed is:

1. A method for visualization of a three-dimensional truss dataset of an escalator or moving walkway using a computer program executed in a computer system, the method comprising:
   determining client-specific configuration data with information at least on a conveyor height and on a step width for an escalator or moving walkway;
   selecting, by the computer program or by manual input, a type-specific, two-dimensional layout based on the client-specific configuration data, wherein this two-dimensional layout comprises, in a plane of a three-dimensional space, the guideway of a revolving conveyor chain and has a defined origin, wherein the type-specific, two-dimensional layout is selected from among a plurality of different type-specific, two-dimensional layouts, each of the plurality of different type-specific, two-dimensional layouts corresponding to a different type of escalator or moving walkway, and wherein a conveyor height associated with the type-specific, two-dimensional layout is different than the conveyor height of the client-specific configuration data;
   adjusting the type-specific, two-dimensional layout, starting from the origin, such that the conveyor height of the type-specific, two-dimensional layout matches the conveyor height of the client-specific configuration data;
   subdividing the guideway of the adjusted type-specific, two-dimensional layout into a plurality of division portions, wherein a length of each of the division portions, except for a remnant division portion, corresponds to the spacing of two sequential hinge points of a type-specific conveyor chain, and wherein a length of the remnant division portion is less than that of the other division portions;
   further adjusting the type-specific, two-dimensional layout by enlarging the circumferential length of the guideway until the remnant division portion has the same length as each of the division portions; and
   generating and visualizing a three-dimensional truss data set based on the further adjusted type-specific, two-dimensional layout.

2. The method according to claim 1, wherein further adjusting the type-specific, two dimensional layout by enlarging the circumferential length of the guideway comprises adding a further division portion with the same length as the division portions in the event of an uneven number of division portions in the initial recording.

3. The method according to claim 1, wherein the guideway has two deflection zones and a forward run portion and a return portion between the deflection zones, and wherein further adjusting the type-specific, two dimensional layout by enlarging the circumferential length of guideway comprises lengthening the forward run portion and the return portion by linearly displacing one of the two deflection zones starting from the origin while maintaining the conveyor height.

4. The method according to claim 3, wherein generating the three-dimensional truss data set based on the further adjusted type-specific, two dimensional layout comprises overlaying the further adjusted type-specific, two-dimensional layout, using a set of rules, with fields of predefined structure, wherein the fields of predefined structure comprise bars and nodes in a truss-like arrangement and wherein an overlaid two-dimensional layout is created by the overlaying.

5. The method according to claim 4, wherein the fields of predefined structure are selected for the overlay from a group comprising a standard field, a top bend section, a bottom bend section, a division section or a compensation field.

6. The method according to claim 4, wherein bearing points are provided in the two deflection zones on the type-specific, two-dimensional layout overlaid with fields, and, if a bearing space of the bearing points does not correspond to a required bearing space of the client-specific configuration data, the bearing space is enlarged by inserting a further field or by lengthening a field in the region of at least one of the two deflection zones.

7. The method according to claim 5, wherein a standard field or a compensation field is replaced by the division section of equal length, either by a manual entry via an interface or on the basis of the client-specific configuration data.

8. The method according to claim 5, wherein the set of rules comprises a test routine, with which a minimum length of a compensation field is checked, and, if the minimum length thereof is not achieved, an adjacent standard field or a half of a division section is combined with the compensation field that has become too short and this combined field is then subdivided into two equally long compensation fields.

9. The method according to claim 4, wherein bar forces in the bars of the individual fields are calculated, based on the set of rules, from the step width and the conveyor height, and wherein a type-specific selection of profile bar datasets for three-dimensional truss model portions is made on the basis of the bar forces, the profile bar datasets of which portions are arranged according to the bars of the fields and from which the truss dataset to be created is composed on the basis of the two-dimensional layout overlaid with fields.

10. The method according to claim 9, wherein two planes are present in the three-dimensional space which are parallel to the plane of the overlaid two-dimensional layout arranged therein, on which planes three-dimensional truss model portions formed from profile datasets are fit together along the overlaid two-dimensional layout in a manner corresponding to the structure of the fields in each case such that two truss model side parts arranged parallel relative to one another are formed in the three-dimensional space as a result, wherein the spacing of these parallel planes or truss model datasets relative to one another is calculated from the step width using the set of rules.

11. The method according to claim 10, wherein the truss model side parts arranged parallel relative to one another are interconnected, at right angles to their planes, by profile bar datasets from a group comprising transverse strut datasets, transverse floor strut datasets, diagonal floor strut datasets and end part datasets with support brackets for the truss dataset.

12. The method according to claim 10, wherein a three-dimensional truss model portion has datasets of a top beam portion, a bottom beam portion, at least one upright and at least one diagonal strut, virtual counterparts of which are arranged, according to the structure of the fields, relative to one another in the three-dimensional space on the two planes.

13. The method according to claim 12, wherein one or a plurality of continuous top beam datasets are generated from the top beam portions of the truss side parts and/or one or a plurality of continuous bottom beam datasets are generated from the bottom beam portions of the truss side parts, wherein the ends thereof are defined by the following structural features of fields: a division point of the division section, a bearing point, a bend point of the top or bottom bend section.

14. The method according to claim 8, wherein the required weld seam lengths to be provided in the individual nodes are calculated based on the set of rules on the basis of the calculated bar forces and geometric data of corresponding truss model portions.

15. The method according to claim 14, wherein the required weld seam lengths of overlapping, connection point-forming profile bar datasets of a node are compared, using the set of rules, to existing geometric relationships in this node, wherein in the case of connection points that are too short, a gusset dataset is provided for the node concerned.

* * * * *